(12) United States Patent
Sato et al.

(10) Patent No.: US 10,886,684 B2
(45) Date of Patent: *Jan. 5, 2021

(54) BONDING METHOD FOR CONDUCTOR OF ELECTRIC WIRE AND ELECTRIC WIRE

(71) Applicant: Yazaki Corporation, Tokyo (JP)

(72) Inventors: Tomoya Sato, Shizuoka (JP); Kazuhide Takahashi, Shizuoka (JP); Naoki Ito, Shizuoka (JP); Yasunori Nabeta, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/288,454

(22) Filed: Feb. 28, 2019

(65) Prior Publication Data

US 2019/0273355 A1    Sep. 5, 2019

(30) Foreign Application Priority Data

Mar. 1, 2018    (JP) ................................ 2018-036345

(51) Int. Cl.
*H01R 4/18* (2006.01)
*H01R 43/02* (2006.01)
(Continued)

(52) U.S. Cl.
CPC ....... *H01R 43/0207* (2013.01); *B23K 20/004* (2013.01); *B23K 20/10* (2013.01);
(Continued)

(58) Field of Classification Search
CPC . H01R 4/18; H01R 4/20; H02G 15/04; B23K 20/10
See application file for complete search history.

(56) References Cited

U.S. PATENT DOCUMENTS

2004/0088857 A1 * 5/2004 Fujimoto ............... H01R 11/12
29/871
2011/0062218 A1 * 3/2011 Ohnuma ............. B23K 20/106
228/110.1
(Continued)

FOREIGN PATENT DOCUMENTS

EP       2 650 984 A1    10/2013
JP      2005-222849 A     8/2005
(Continued)

*Primary Examiner* — Chau N Nguyen
(74) *Attorney, Agent, or Firm* — Sughrue Mion, PLLC

(57) ABSTRACT

A bonding method for a conductor of an electric wire including a conductor formed of a plurality of strands and a sheath covering the conductor such that the conductor is exposed to a predetermined length. The bonding method includes bonding the strands to each other, the strands being spaced apart from the sheath by a predetermined length. An outer diameter of a middle portion of the conductor between a bonded portion and a portion covered with the sheath gradually decreases toward the bonded portion. A maximum value of an intersection angle between an upper surface of the bonded portion or a longitudinal direction of the electric wire and the strands of the middle portion is smaller than a predetermined angle. The predetermined angle is an angle at which breakage of the strands is prevented when the bonding is performed.

3 Claims, 10 Drawing Sheets

(51) Int. Cl.
 *B23K 20/00* (2006.01)
 *B23K 20/10* (2006.01)
 *B23K 101/38* (2006.01)

(52) U.S. Cl.
 CPC ............ *H01R 4/185* (2013.01); *H01R 4/187* (2013.01); *B23K 2101/38* (2018.08); *H01L 2224/85205* (2013.01)

(56) References Cited

U.S. PATENT DOCUMENTS

2011/0094797 A1    4/2011  Otsuka et al.
2016/0071630 A1*   3/2016  Sugino .................. H01R 4/021
                                                   174/68.3

FOREIGN PATENT DOCUMENTS

| | | |
|---|---|---|
| JP | 2009-231079 A | 10/2009 |
| JP | 2011-82127 A | 4/2011 |
| JP | 2014-154443 A | 8/2014 |
| JP | 2015-135742 A | 7/2015 |

\* cited by examiner

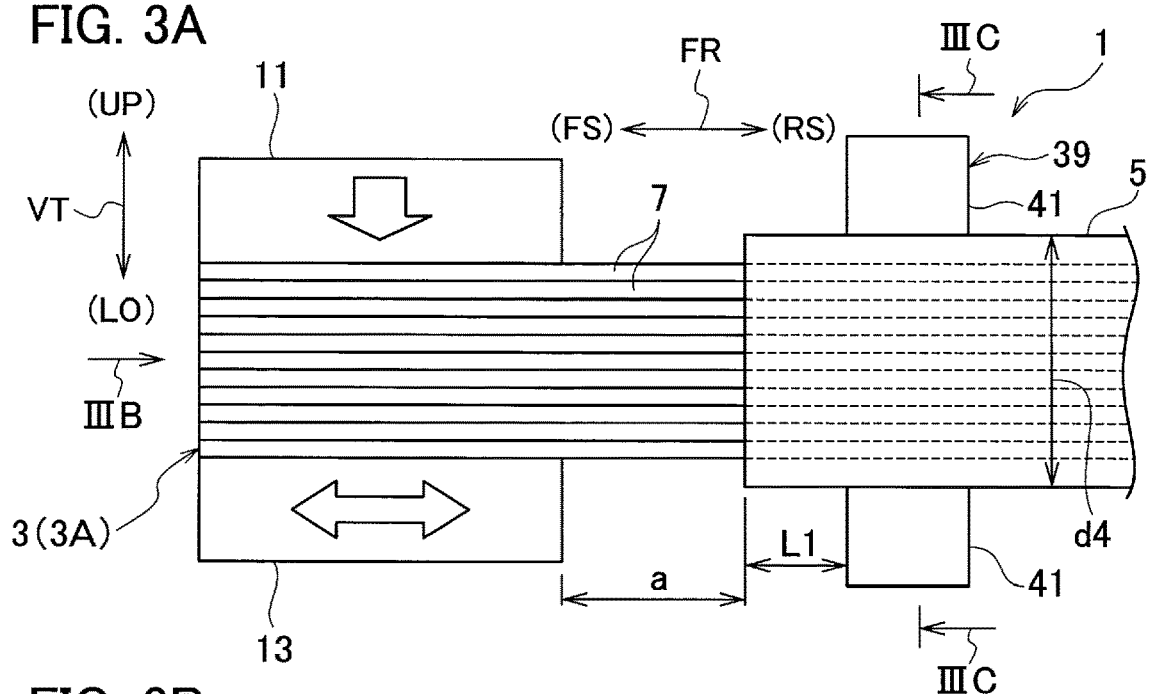
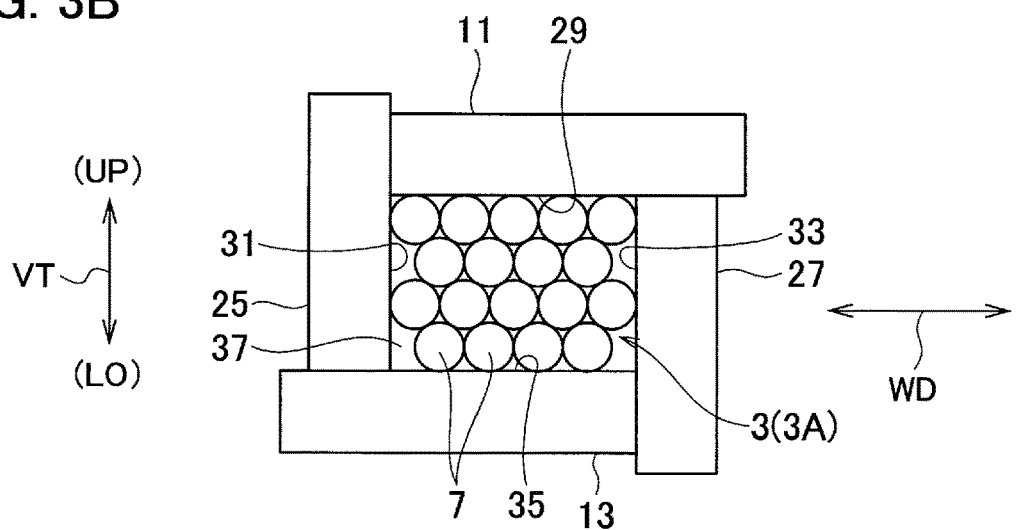
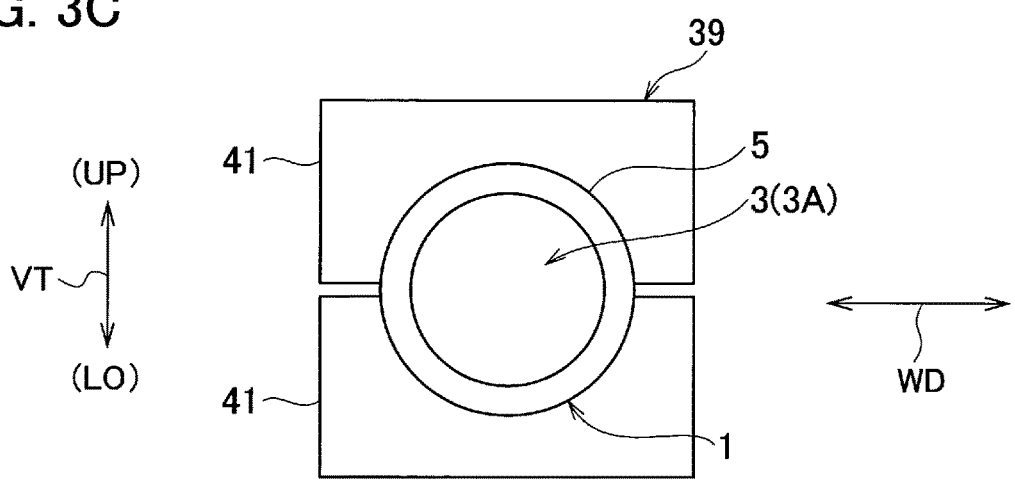

FIG. 13B  FIG. 13A
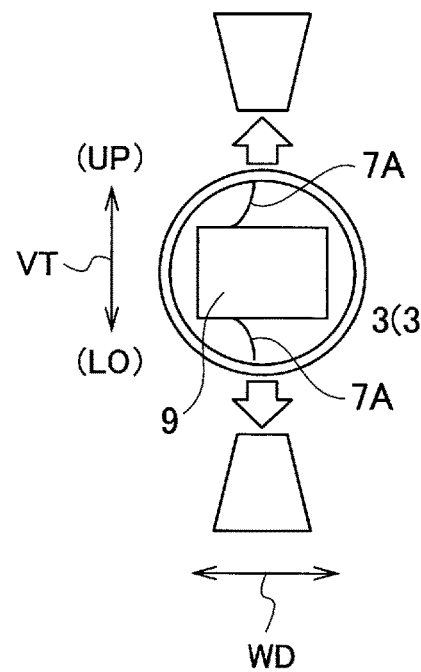
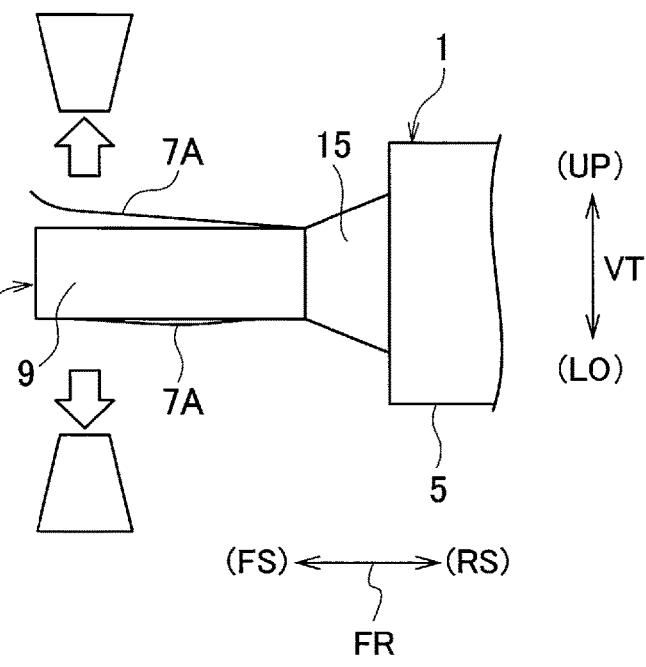
FIG. 14B  FIG. 14A
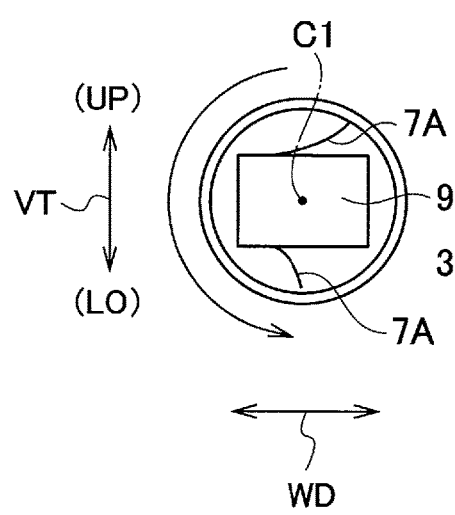
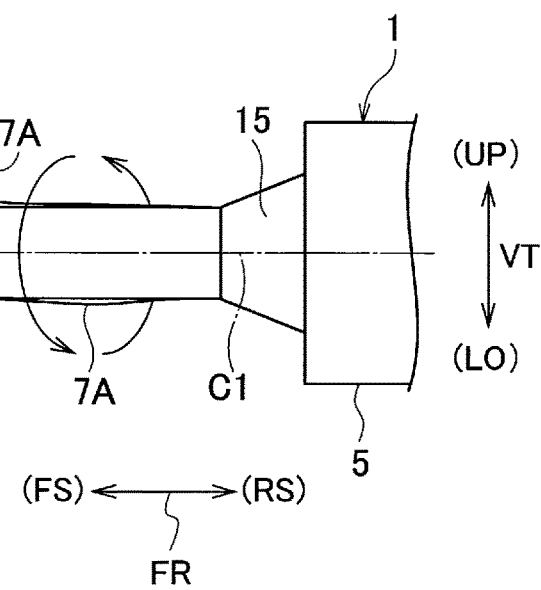

BONDING METHOD FOR CONDUCTOR OF ELECTRIC WIRE AND ELECTRIC WIRE

CROSS REFERENCE TO RELATED APPLICATION

This application is based upon and claims the benefit of priority from the prior Japanese Patent Application No. 2018-036345 (filing date: Mar. 1, 2018), the entire contents of which are incorporated herein by reference.

BACKGROUND

Technical Field

The present invention relates to a bonding method for a conductor of an electric wire and an electric wire, and in particular, to a method for bonding a plurality of strands to each other in a part of a conductor of an electric wire.

Related Art

Conventionally, technology has been known in which a part of a conductor of an electric wire is clamped between an anvil and a horn in a vertical direction and a plurality of strands constituting the conductor are bonded to each other by ultrasonic vibrating the horn in a longitudinal direction of the electric wire (front rear direction) (see JP 2015-135742 A).

On the other hand, when the strands are bonded to each other by ultrasonic bonding using an anvil and a horn as in the prior art, each of the strands is compressed in a bonded portion in which the strands are ultrasonically bonded to each other, that is, a portion of the strands clamped between the anvil and the horn.

Due to the compression, the strands positioned in a middle portion existing between the sheath and the bonded portion in the longitudinal direction (front-rear direction) of the electric wire are pulled (tensile stress is generated in each strand).

Therefore, when the value of the tensile stress occurring in the strands in this manner becomes large, the strand may be broken when ultrasonic bonding is performed.

The strand breakage described above may also occur when the strands are joined to each other by a method other than ultrasonic joining.

SUMMARY

The present invention has been made in view of the above problems, and it is an object of the present invention to provide a bonding method for a conductor of an electric wire and the electric wire, a conductor formed of a plurality of strands and a sheath covering the conductor such that the conductor is exposed to a predetermined length, which prevent occurrence of strand breakage when a plurality of strands of the electric wire are bonded to each other.

A bonding method according to first aspect of the present invention is a bonding method for a conductor of an electric wire including a conductor formed of a plurality of strands and a sheath covering the conductor such that the conductor is exposed to a predetermined length, the bonding method bonding the plurality of strands of the electric wire to each other. The method includes bonding the strands of the conductor exposed from the sheath to each other, the strands being spaced apart from the sheath by a predetermined length. An outer diameter of a middle portion of the conductor between a bonded portion formed by bonding the strands of the conductor to each other and a portion covered with the sheath gradually decreases toward the bonded portion from the portion of the conductor covered with the sheath. A maximum value of an intersection angle between an upper surface of the bonded portion or a longitudinal direction of the electric wire and the strands of the middle portion of the conductor is smaller than a predetermined angle. The predetermined angle is an angle at which breakage of the strands is prevented when the bonding is performed.

The bonded portion may be formed by performing ultrasonic bonding using an anvil and a horn. The anvil and the horn may be provided with an inclined surface contacting a portion of the middle portion on a side of the bonded portion throughout a predetermined length.

The bonded portion may be formed by performing ultrasonic bonding using an anvil and a horn. When ultrasonic bonding of the conductor is performed by clamping a part of the conductor exposed from the sheath between the anvil and the horn throughout a predetermined length and ultrasonically vibrating the horn, a distance from the anvil or the horn to the sheath of the electric wire may be shorter than a length of the strands when the strand vibrates in a primary mode by ultrasonic vibration.

After the bonded portion is formed, a bonding state of the bonded portion may be inspected by performing at least one of allowing a fluid having a flow rate exceeding a predetermined speed to flow to the bonded portion and applying an acceleration exceeding a predetermined magnitude to the bonded portion.

An electric wire according to second aspect of the present invention includes a conductor formed of a plurality of strands and a sheath covering the conductor such that the conductor is exposed to a predetermined length. The electric wire includes a bonded portion spaced apart from the sheath by a predetermined length, in which the strands of the conductor exposed from the sheath are bonded to each other, and a middle portion of the conductor formed between the bonded portion and the sheath. An outer diameter of the bonded portion is smaller than an outer diameter of the conductor in the portion covered with the sheath, and an outer diameter of the middle portion of the conductor gradually decreases toward the bonded portion from a portion of the conductor covered with the sheath. A maximum value of an intersection angle between an upper surface of the bonded portion or a longitudinal direction of the electric wire and the strands of the middle portion of the conductor is smaller than a predetermined angle. The predetermined angle is an angle at which breakage of all the strands of the middle portion due to formation of the bonded portion is prevented.

The bonded portion may be in a state in which ultrasonic bonding is completed using the anvil and the horn. A distance between the bonded portion and the sheath of the electric wire may be shorter than a length of the strands when the strands are vibrated in a primary mode by ultrasonic vibration.

A bonding method for a conductor of an electric wire and the electric wire, a conductor formed of a plurality of strands and a sheath covering the conductor such that the conductor is exposed to a predetermined length, according to aspects of the present invention prevent occurrence of strand breakage when a plurality of strands of the electric wire are bonded to each other.

BRIEF DESCRIPTION OF DRAWINGS

FIG. 3A is a diagram illustrating a bonding method for a conductor of an electric wire according to an embodiment of the present invention;

FIG. 3B is a diagram viewed along arrow IIIB of FIG. 3A;

FIG. 3C is a cross-sectional view taken along IIIC-IIIC of FIG. 3A;

FIG. 13A is a diagram illustrating an electric wire in which some of strands are not bonded to a bonded portion and a state in which strands that are not bonded to the bonded portion are separated from the bonded portion and stretch out;

FIG. 13B is a side view of FIG. 13A;

FIG. 14A is a diagram illustrating an electric wire in which some of strands are not bonded to a bonded portion and a state in which strands that are not bonded to the bonded portion are separated from the bonded portion and stretch out;

FIG. 14B is a side view of FIG. 14A;

DETAILED DESCRIPTION

Figure 1:
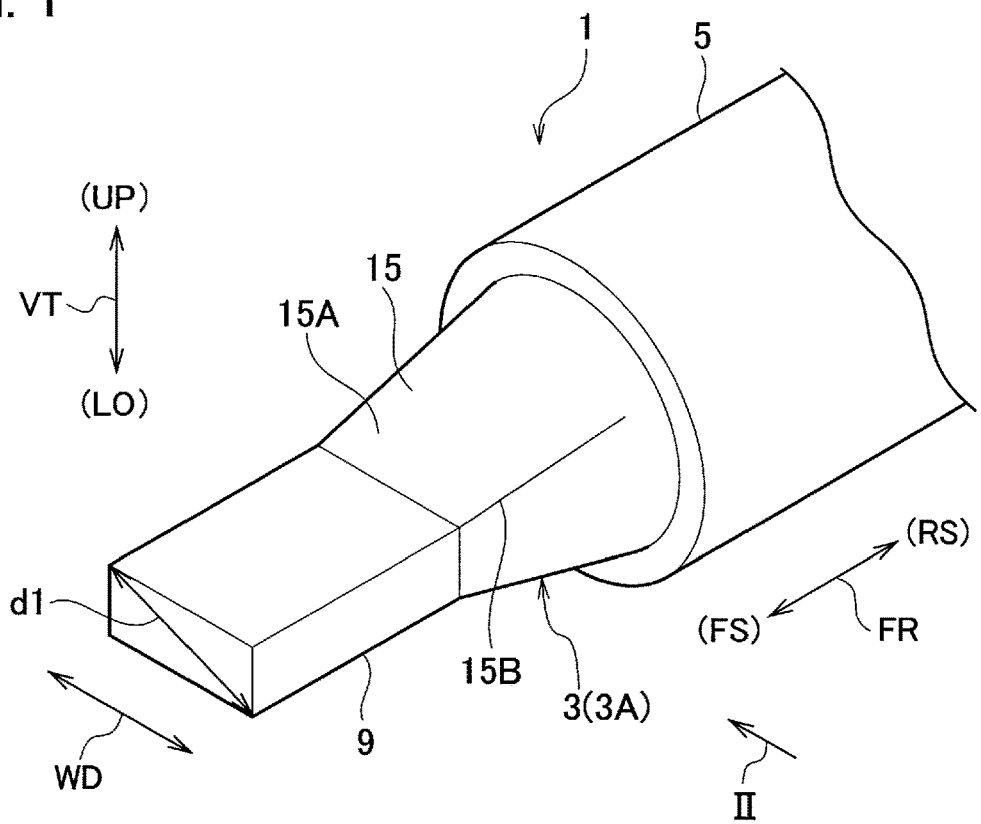
FIG. 1 is a perspective view illustrating an electric wire obtained by a bonding method for a conductor of an electric wire according to an embodiment of the present invention.

An electric wire 1 manufactured by a bonding method for a conductor of an electric wire according to an embodiment of the present invention will be described below with reference to FIGS. 1 and 2.

For convenience of description, the longitudinal direction of the electric wire 1 is defined as the front-rear direction, one predetermined direction orthogonal to the front rear direction is defined as the vertical direction, and a direction orthogonal to the longitudinal direction and the vertical direction is defined as a width direction.

The electric wire 1 includes a conductor 3 and a sheath 5. The conductor 3 is formed of a plurality of strands 7. The sheath 5 covers the conductor 3 such that the conductor 3 is exposed to a predetermined length. The conductor 3 is exposed to the predetermined length in, for example, a front end of the electric wire 1.

A bonded portion 9 is formed in the electric wire 1. The bonded portion 9 is spaced apart from the sheath 5 by a predetermined distance in the front rear direction and is formed to have a predetermined length in the front rear direction. In the bonded portion 9, the strands 7 of the conductor 3A which is exposed (exposed conductor) (see FIGS. 3A to 3C; separate strands are not illustrated in FIGS. 1 and 2) are bonded to each other by ultrasonic bonding (ultrasonic treatment) using an anvil 11 and a horn 13. The conductor 3 becomes, for example, a single wire in the bonded portion 9, for example.

In addition, a middle portion 15 is formed in the electric wire 1. The middle portion 15 is formed between the bonded portion 9 and the sheath 5 in the front rear direction. In the middle portion 15, the strands 7 of the exposed conductor 3A are not bonded to each other, but in the vicinity of the bonded portion 9, the strands 7 may be bonded to each other due to the influence of the ultrasonic bonding using the anvil 11 and the horn 13.

The bonded portion 9 is formed in a rectangular parallelepiped shape (a square column shape), and the dimension thereof in the width direction is greater than the dimension in the vertical direction. In addition, when viewed in the front rear direction, a portion of the conductor 3 covered with the sheath 5 has a circular shape (see FIG. 3C).

The cross-sectional shape of the bonded portion 9 (the cross-sectional shape taken along the plane orthogonal to the front rear direction) is smaller than the cross-sectional shape of the portion of the conductor 3 covered with the sheath 5. The cross-sectional shape of the middle portion 15 gradually changes from the circular shape of the portion covered by the sheath 5 to the rectangular shape of the bonded portion 9.

When seen in the front-rear direction, the rectangular-shaped bonded portion 9 is positioned inside the circular-shaped conductor 3 covered with the sheath 5, and the center of the conductor 3 covered with the sheath 5 and the center of the bonded portion 9 coincide with each other. In addition, the center of the conductor 3 covered with the sheath 5 and the center of the bonded portion 9 may be deviated from each other.

The outer diameter (the maximum outer diameter d1 illustrated in FIG. 1 and the minimum outer diameter d2 illustrated in FIG. 2) of the bonded portion 9 is smaller than the outer diameter d3 (see FIG. 2) of the portion of the conductor 3 covered with the sheath 5 (more precisely, the portion of the conductor 3 at an end of the sheath 5 at a position at which the conductor 3 starts to be exposed).

The outer diameter of the middle portion 15 of the conductor 3 gradually decreases toward the bonded portion 9 from the portion of the conductor 3 covered with the sheath 5 (toward the front side from the rear side).

In the electric wire 1, the value x (see FIG. 2) of a length dimension (a dimension in the front rear direction) of the middle portion 15 is less than a value of a length dimension L (see formula "f1" described below) required for the strands 7 to resonantly vibrate in the primary mode between the anvil 11 (or the horn 13) and the sheath 5 by ultrasonic vibration, the ultrasonic vibration performed on the strands 7 to form the bonded portion 9. The length dimension L will be described below.

In addition, in the electric wire 1, the maximum value $\theta$ of the intersection angle between an upper surface of the bonded portion 9 or the front and rear direction and the strands 7 of the middle portion 15 of the conductor 3 is smaller than a predetermined angle $\theta a$. The upper surface of the bonded portion 9 may be a lower surface of the bonded portion 9.

Figure 2:
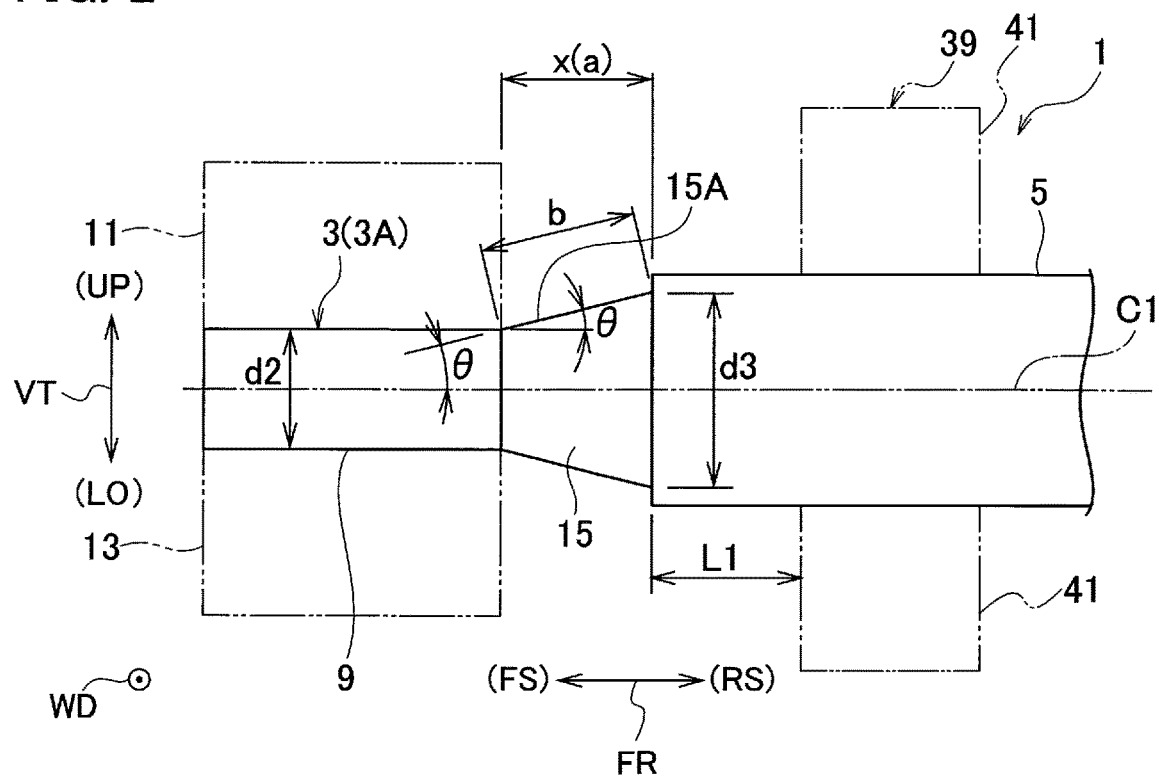
FIG. 2 is a diagram illustrating a bonding method for a conductor of an electric wire according to an embodiment of the present invention.

The intersection angle between the front-rear direction (the central axis C1 of the electric wire 1) and the outer peripheral surface 15A of the middle portion 15 may be adopted as the maximum value $\theta$ of the intersection angle (see FIG. 2).

The maximum value $\theta$ of the intersection angle may be an angle at which the breakage of all the strands 7 of the middle portion 15 due to ultrasonic bonding can be prevented. More specifically, the maximum value $\theta$ of the intersection angle is an angle at which a strand 7 intersecting at the angle of maximum value $\theta$ with respect to the front rear direction among the strands 7 of the middle portion 15 does not cause fatigue fracture even due to compression of the strands 7 at the bonded portion 9 and ultrasonic vibration during ultrasonic bonding. The maximum value $\theta$ of the intersection angle and the predetermined angle $\theta a$ will be described below.

Figure 4:
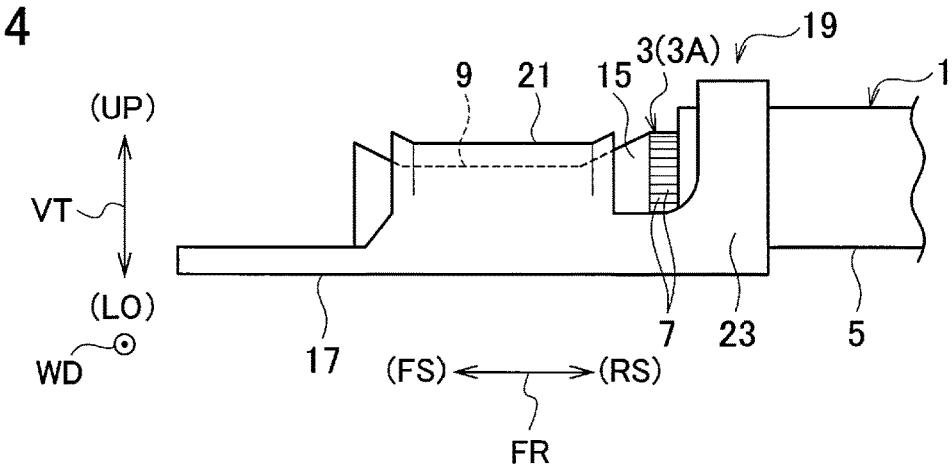
FIG. 4 is a diagram illustrating an electric wire with a terminal in which a terminal is fixed in an electric wire obtained by a bonding method for a conductor of an electric wire according to an embodiment of the present invention.

As illustrated in FIG. 4, a terminal 17 is fixed in the electric wire 1 illustrated in FIG. 1 or 2 and therefore, an electric wire 19 with a terminal is obtained.

The terminal 17 is provided with a wire barrel portion 21 and an insulation barrel portion 23. In the electric wire 19 with the terminal, since the wire barrel portion 21 is crimped, the wire barrel portion 21 and the bonded portion 9 are integrated together, and since the insulation barrel portion 23 is crimped, the insulation barrel portion 23 and a front end of the sheath 5 are integrated together.

A bonding method for a conductor of an electric wire according to an embodiment of the present invention will be described below.

The bonding method for a conductor of an electric wire according to an embodiment of the present invention is, as illustrated in FIGS. 2 to 3C, a method of ultrasonically bonding a plurality of strands 7 of an electric wire 1 to each other using an anvil 11 and a horn 13, the electric wire 1 including a conductor 3 formed of the plurality of strands 7 and a sheath 5 covering the conductor 3 such that the conductor 3 is exposed to a predetermined length.

In the bonding method for a conductor of an electric wire according to an embodiment of the present invention, a part of the conductor (exposed conductor) 3A that is exposed is clamped between the anvil 11 and the horn 13 throughout a predetermined length and the horn 13 is ultrasonically vibrated in the longitudinal direction (in the front rear direction) of the strands 7 (conductor 3) to ultrasonically bond the strands 7 to each other.

The ultrasonic bonding will be described in detail below.

The electric wire 1 includes, as described above, a conductor (core wire) 3 formed by gathering a plurality of strands 7 and a sheath (insulator) 5 covering (coating) the conductor 3.

In addition, in the electric wire 1 before the strands 7 are ultrasonically bonded to each other, since the sheath 5 is not present (the sheath 5 is eliminated) in a part of the electric wire 1 in the longitudinal direction (for example, one end), the conductor 3 is exposed to a predetermined length (an exposed conductor 3A is formed).

The strands 7 of the conductor 3 are made of metal such as copper, aluminum, or aluminum alloy, and are formed in an elongated cylindrical shape. The conductor 3 is formed in a form in which a plurality of strands 7 are twisted, or a form in which a plurality of strands 7 are arranged and extend linearly.

In addition, the cross-section of the portion of the electric wire 1 where the sheath 5 is present (cross-section taken along a plane orthogonal to the longitudinal direction) is formed in a predetermined shape such as a circular shape.

Although the electric wire 1 is flexible, for convenience of description, it is assumed that the electric wire 1 extends linearly.

The cross section of the conductor 3 at the portion of the electric wire 1 where the sheath 5 is present is formed in a generally circular shape because a plurality of the strands 7 are bundled in a state of almost no gap therebetween. The cross section of the sheath 5 at the portion of the electric wire 1 where the sheath 5 is present is formed in an annular shape with a predetermined width (thickness). The entire of the inner circumference of the sheath 5 is in contact with the entire of the outer circumference of the conductor 3.

Further, in the portion of the electric wire 1 where the sheath 5 is present, the strands 7 are tightened by the sheath 5 (the strands 7 receives an urging force from the sheath 5 such that the cross-section of the conductor 3 becomes smaller). Therefore, the strands 7 are gathered and are integrated together in the portion of the electric wire 1 where the sheath 5 is present, and vibration at each of the strands 7 is rapidly reduced. The urging force by the sheath 5 almost does not exist in a middle portion 15.

The ultrasonic bonding of the strands 7 is, as illustrated in FIG. 2 and FIGS. 3A and 3B, performed by using, for example, a grinding jaw 25, an anvil plate 27, a horn 13, and an anvil 11.

In each of the anvil 11, the grinding jaw 25, the anvil plate 27, and the horn 13, planes or planar portions (for example, planar portions having fine irregularities) 29, 31, 33, 35 are formed in the anvil 11, the grinding jaw 25, the anvil plate 27, and the horn 13, respectively.

The planar portion 31 of the grinding jaw 25 and the planar portion 33 of the anvil plate 27 are orthogonal to each other in the width direction and face each other in parallel. The distance between the planar portion 31 of the grinding jaw 25 and the planar portion 33 of the anvil plate 27 is adjustable through position determination by moving at least one of the grinding jaw 25 and the anvil plate 27 in the width direction.

The planar portion 35 of the horn 13 and the planar portion 29 of the anvil 11 are orthogonal to each other in the vertical direction and face each other in parallel. As understood above, the planar portion 31 of the grinding jaw 25 and the planar portion 33 of the anvil plate 27, and the planar portion 35 of the horn 13 and the planar portion 29 of the anvil 11 are orthogonal to each other.

The distance between the planar portion 35 of the horn 13 and the planar portion 29 of the anvil 11 is changed by moving at least one of the horn 13 and the anvil 11 in the vertical direction. For example, the distance between the planar portion 35 of the horn 13 and the planar portion 29 of the anvil 11 can be changed by moving the anvil 11 with specified force using an actuator such as an air pressure cylinder with respect to the horn 13.

In addition, a quadrangular prism shaped space 37, both ends of which are open in the front rear direction, is formed by the grinding jaw 25, the anvil plate 27, the horn 13, and the anvil 11. The quadrangular prism shaped space 37 is surrounded by the planar portion 31 of the grinding jaw 25, the planar portion 33 of the anvil plate 27, the planar portion 35 of the horn 13, and the planar portion 29 of the anvil 11.

When ultrasonic bonding is performed, a conductor 3A which is exposed (exposed conductor) is inserted into the quadrangular prism shaped space 37 such that the longitudinal direction of the strands 7 coincides with the front rear direction of the quadrangular prism shaped space 37.

That is, when ultrasonic bonding is performed, the exposed conductor 3A is inserted into the quadrangular prism shaped space 37 such that the longitudinal direction of the strands 7 is parallel with the planar portion 31 of the grinding jaw 25, the planar portion 33 of the anvil plate 27, the planar portion 35 of the horn 13, and the planar portion 29 of the anvil 11 (becomes the front rear direction).

In a state where the strands 7 of the exposed conductor 3A are inserted into the quadrangular prism shaped space 37, the ultrasonic bonding of the strands 7 is made by moving the anvil 11 toward the horn 13 to press the strands 7 with the anvil 11 and the horn 13 and at the same time, ultrasonically vibrating the horn 13. By ultrasonically bonding the strands 7, inserted into the quadrangular prism shaped space 37, to each other, a bonded portion 9 with a predetermined length is formed in a part of the exposed conductor 3A in the longitudinal direction.

The vibration direction of the horn 13 at the time of ultrasonic bonding is, for example, the front rear direction (the longitudinal direction of the strands 7). Furthermore, since the strands 7 are pressed with the anvil 11 and the horn 13, the planar portion 31 of the grinding jaw 25 and the planar portion 33 of the anvil plate 27 receive the pressing force from the strands 7.

In the case of ultrasonic bonding, the distance x between the anvil 11 and the horn 13 (more precisely, an end of the exposed conductor 3A, clamped between the anvil 11 and the horn 13, on the side of the sheath 5) and the sheath 5 of the electric wire 1 (see FIG. 2) is shorter than a length L in a case where the strand 7 is vibrated in the primary mode (a length in a case where vibration is generated in the primary mode at a single strand 7 due to the ultrasonic vibration of the horn 13) (x<L).

The above-mentioned length L may be expressed by the formula f1 described below.

$$L = m \left( \frac{1}{2\pi f} \right)^{\frac{1}{2}} \left( \frac{EI}{\rho A} \right)^{\frac{1}{4}} \quad (f1)$$

The formula f1 is a formula showing a primary vibration mode of a strand in a middle portion of a conductor of an electric wire according to an embodiment of the present invention; In the formula f1, "m" is a constant, and a value thereof is "4.730". In the formula f1, "f" is an ultrasonic frequency (the frequency of the horn 13), and its unit is "Hz".

In the formula f1, "$\rho$" is the density of the strands 7, and its unit is "kg/m$^3$". In the formula f1, "A" is the cross-sectional area of a single strand 7 (the area of a cross-section taken along a plane orthogonal to the longitudinal direction), and its unit is "m$^2$". In the formula f1, "E" is the Young's modulus of the strand 7 (longitudinal elastic modulus), and its unit is "N/m$^2$". In the formula f1, "I" is the cross-sectional secondary moment of a single strand 7, and its unit is "m$^4$".

On the other hand, in the electric wire 1 illustrated in FIG. 1 or 2, the outer diameter of a middle portion 15 of the conductor 3 positioned between the bonded portion 9 formed by ultrasonic bonding and a portion covered by the sheath 5 (a portion of the conductor 3 positioned between the bonded portion 9 and the sheath 5 in the front rear direction) gradually decreases from the portion covered by the sheath 5 toward the bonded portion 9 (from the rear side toward the front side), as described above.

In addition, in the electric wire 1, the maximum value θ of the intersection angle between the longitudinal direction (the front rear direction) of the electric wire 1 and the strands 7 of the middle portion 15 of the conductor 3 is smaller than a predetermined angle θa (θ<θa).

The predetermined angle (breakage prevention angle) θa is an angle at which breakage of all the strands 7 in the middle portion 15 can be prevented when the ultrasonic bonding is performed (when the ultrasonic bonding is performed or when the ultrasonic bonding is completed).

In addition, the predetermined angle θa is an angle at which all the strands 7 in the middle portion 15 does not cause fatigue fracture by a load applied to the strands 7 due to compression of the strands 7 at the bonded portion 9 and ultrasonic vibration when the ultrasonic bonding is performed or when the ultrasonic bonding is completed.

The fatigue fracture is caused by the fluctuation load (repeated load) applied to the strands 7 of the middle portion 15 and a static load applied to the strands 7 of the middle portion 15 and is, for example, fracture of the strands 7 in the middle portion 15.

The fluctuation load is a load (for example, a vibration load) applied to the strands 7 of the middle portion 15 due to the vibration of the horn 13 at the time of ultrasonic bonding. The repeated stress is caused in the strands 7 of the middle portion 15 due to the fluctuation load.

Since the strands 7 are vibrated similarly by the vibration of the horn 13, values of the repeated stress occurring in the respective strands 7 are almost equal to each other.

When the fracture of the strands 7 due to only the fluctuation load is defined as pure fatigue fracture, it is determined whether or not pure fatigue fracture occurs depending on forms of repeated stress occurring in the strands 7 by ultrasonic bonding (a force for clamping a plurality of strands 7 between the anvil 11 and the horn 13, a vibration frequency of the horn 13, an amplitude of the horn 13, etc.), a time during which the repeated stress occurs in the strands 7 due to the ultrasonic bonding, a material of the strands 7, and the like.

The static load is a load applied to the strands 7 of the middle portion 15 as the outer diameter of the middle portion 15 of the conductor 3 gradually decreases from the rear side toward the front side. The static load is not generated in a state before the strands 7 (conductor 3) are clamped between the anvil 11 and the horn 13 (for example, see FIG. 3A).

In the state before the strands 7 are clamped between the anvil 11 and the horn 13 (for example, see FIG. 2), and the horn 13 starts to be vibrated, a distance between the anvil 11 and the horn 13 (a distance in the vertical direction) is smaller than the outer diameter d3 of the portion covered with the sheath 5 of the conductor 3.

Therefore, most of the strands 7 of the middle portion 15 stretches out obliquely. Each of the strands 7 extends except a part (except a part extending along the central axis C1), and distortion in each of the strands 7 occurs, resulting in occurrence of static stress in most of the strands 7.

Thereafter, when ultrasonic vibration is performed on the horn 13, bonding of the strands 7 is made and the bonded portion 9 is then formed. In this case, the distance between the anvil 11 and the horn 13 (the distance in the vertical direction) gradually decreases and the shape of the middle portion 15 is gradually changed.

As a result, the values of the static stress in the respective strands 7 gradually increase, and as illustrated in FIG. 2, a height dimension of the bonded portion 9 becomes "d2" and, when the ultrasonic bonding is completed, the height dimension reaches the maximum.

Although the values of the above-mentioned repeated stress are almost the same with respect to the respective strands 7 in the middle portion 15, the values of the static stress are different depending on the positions of the strands 7 in the middle portion 15.

For example, the value of the repeated stress of the strands 7 positioned at the central axis C1 and the value of the repeated stress of the strands 7 positioned in an outer peripheral surface 15A are almost equal to each other. In contrast, the value of the static stress of the strands 7 positioned at the central axis C1 is almost "0", and static stress occurs in the strands 7 positioned in the outer peripheral surface 15A. The value of the static stress increases as the value of the intersection angle of the strand 7 with respect to the front rear direction increases.

Therefore, the static stress occurring in the strand 7 varies depending on a shape of the middle portion 15, diameters of the strands 7, positions of the strands 7 constituting the middle portion 15, and the like.

When the fracture of the strand 7 due to the static load alone is considered in the formation of the bonded portion 9 using the anvil 11 and the horn 13, only an intersection angle $\theta b$ of a strand 7 in which the value of the intersection angle with respect to the front rear direction is the maximum can be considered after the formation of the bonded portion 9.

The intersection angle $\theta b$ can be calculated by the formula f2; $\theta b = \cos^{-1}(1/(1+\varepsilon))$. Here, "$\varepsilon$" indicates a distortion of the strand 7 having the maximum value of the intersection angle with respect to the front rear direction (for example, the strand positioned in the outer peripheral surface 15A of the middle portion 15 illustrated in FIG. 2).

Also, "$\varepsilon$" can also be expressed by the dimension a, shown in FIG. 2 or 3, and the dimension b shown in FIG. 2. That is, $\varepsilon = (b-a)/a$.

In FIG. 2, the static stress $\sigma s$ of the strand 7 positioned in the outer peripheral surface 15A is given by the formula f3; $\sigma s = \varepsilon E$. "E" is the longitudinal elastic modulus of the strand 7.

Since the fatigue fracture of the strand 7 needs to be considered in conjunction with the pure fatigue fracture of the strand 7 and the fracture due to the static load of the strand 7, the above-mentioned predetermined intersection angle $\theta a$ is smaller than the intersection angle $\theta b$ for avoiding fracture caused by the static load alone.

Therefore, a relationship of the maximum value of the intersection angle $\theta$ illustrated in FIG. 2 < the predetermined intersection angle $\theta a$ < the intersection angle $\theta b$ for avoiding fracture caused by the static load alone is established.

The difference between the intersection angle $\theta b$ and the intersection angle $\theta a$ is determined by a type of the ultrasonic bonding, such as the vibration frequency of the horn 13, as understood already.

The intersection angle between the front rear direction and the strand 7 will be further described below.

When the bonded portion 9, the middle portion 15 and the portion covered with sheath 5 in electric wire 1 illustrated in FIG. 1 or 2 is viewed from a direction (a vertical direction, a width direction, or an oblique direction with respect to the vertical direction and the width direction) orthogonal to an extending direction (the longitudinal direction of the electric wire 1) of the central axis C1 of the electric wire 1, most of a plurality of strands 7 intersect at predetermined angles with respect to the longitudinal direction of the electric wire 1 (the front rear direction) in the middle portions 15 as described above. As described above, the values of the intersection angles of the plurality of strands 7 are different from each other.

Here, the intersection angle will be described for sure. Generally, there are two intersection angles as the intersection angle of two straight lines on the plane. The sum of these two intersection angles is 180°. One angle of the two intersection angles is an acute angle and the other intersection angle is an obtuse angle. The intersection angle $\theta$ ($\theta a$, $\theta b$) in the present specification is the smaller one of the two intersection angles (acute angle) as already understood.

The intersection angle varies depending on the angle at which the electric wire 1 is viewed. For example, when the strands 7 positioned in the outer peripheral surface 15A of the middle portion 15 are viewed in the width direction, the intersection angle becomes "$\theta$" as illustrated in FIG. 2, and, when the strands 7 positioned in the outer peripheral surface 15A of the middle portion 15 are viewed in the vertical direction, the intersection angle becomes "0°".

In the case where the strands 7 are not twisted, the strands 7 are parallel to each other and extend in the longitudinal direction of the electric wire 1 in the portion of the conductor 3 covered with the sheath 5. In addition, when the strands 7 are not twisted, the maximum of the intersection angle is indicated by reference symbol "$\theta$" in FIG. 2.

Although the intersection angle of the strands 7 position in the outer peripheral surface 15A of the middle portion 15 is largest in the above description, the intersection angle of the strands 7 positioned in ridge lines 15B of the middle portion 15 illustrated in FIG. 1 or other strands may be the largest.

In the above description, the strands 7 are not twisted, and therefore, the intersection angle is caught two-dimensionally, but, in a case where the strands 7 are twisted, the intersection angle may be caught three-dimensionally by considering the twisting of the strands 7.

Figure 6:
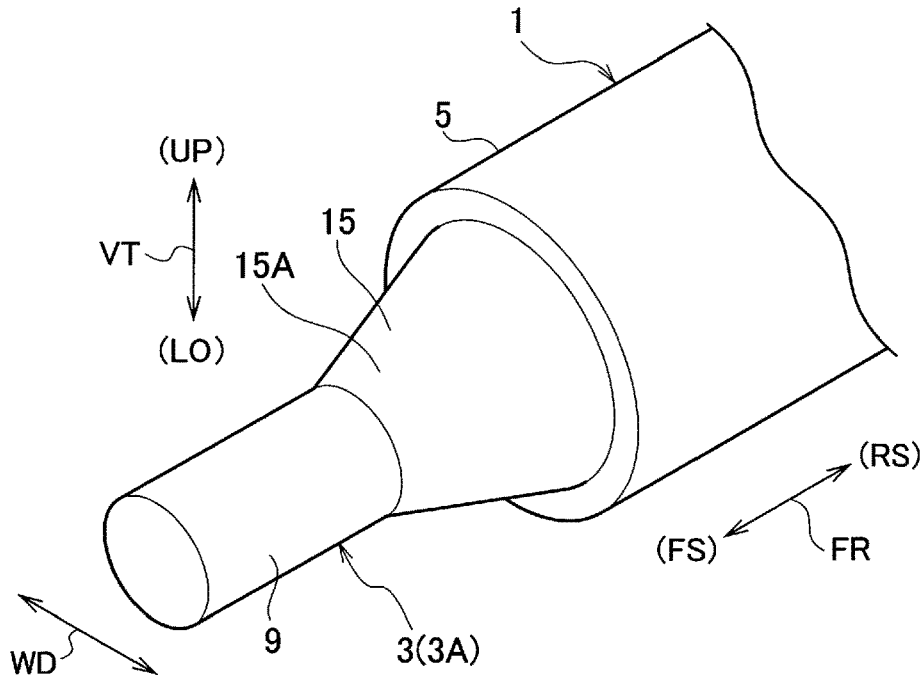
FIG. 6 is a perspective view illustrating an electric wire obtained by a bonding method for a conductor of an electric wire according to a modification.

Although the bonded portion 9 is formed in a rectangular shape in the above description, the bonded portion 9 may be formed in a cylindrical shape as illustrated in FIG. 6. In addition, the cross-sectional shape of the portion of the conductor 3 covered with the sheath 5 may have another shape such as a rectangular shape.

Figure 5:
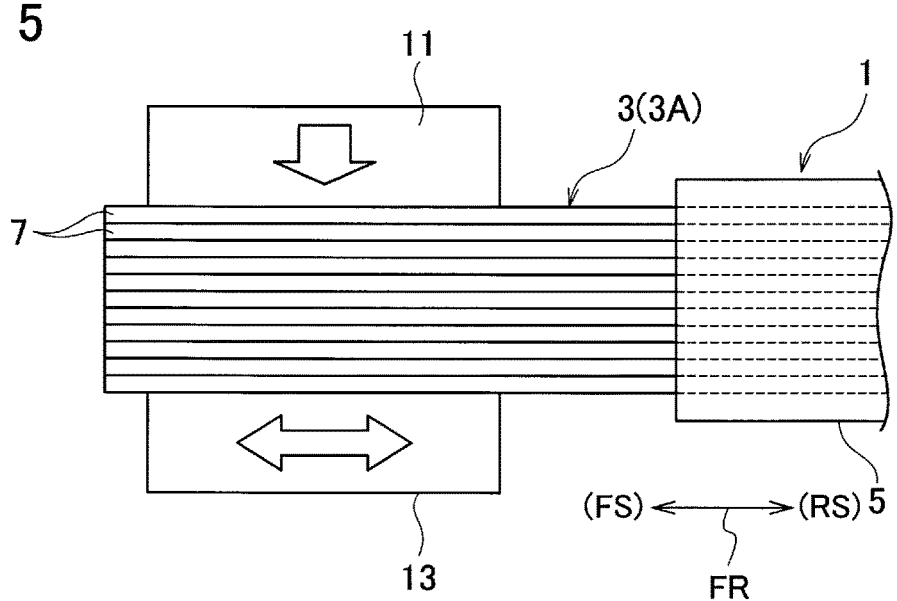
FIG. 5 is a diagram illustrating a bonding method for a conductor of an electric wire according to a modification.

Furthermore, in the above description, although, when ultrasonic bonding is performed, as illustrated in FIG. 2, the position of the front end of the conductor 3 of the electric wire 1 and the position of the front end of the anvil 11 and the horn 13 coincide with each other in the front-rear direction, the front end of the conductor 3 of the electric wire 1 may be positioned on the front side than the front ends of the anvil 11 and the horn 13, or may be positioned on the rear side, as illustrated in FIG. 5.

On the other hand, when ultrasonic bonding of the conductor 3 of the electric wire 1 is performed using the anvil 11 and the horn 13, as illustrated in FIGS. 2, 3A and 3C, the sheath 5 of the electric wire 1 is clamped by a sheath holding part 39 having a pair of clampers 41.

In this case, the distance L1 between the pair of clampers 41 and the front end of the sheath 5 is appropriately determined. The distance L1 may be set to "0", or the value of the distance L1 may be smaller or larger than the value of the outer diameter d4 of the electric wire 1 (the sheath 5).

Figure 10A:
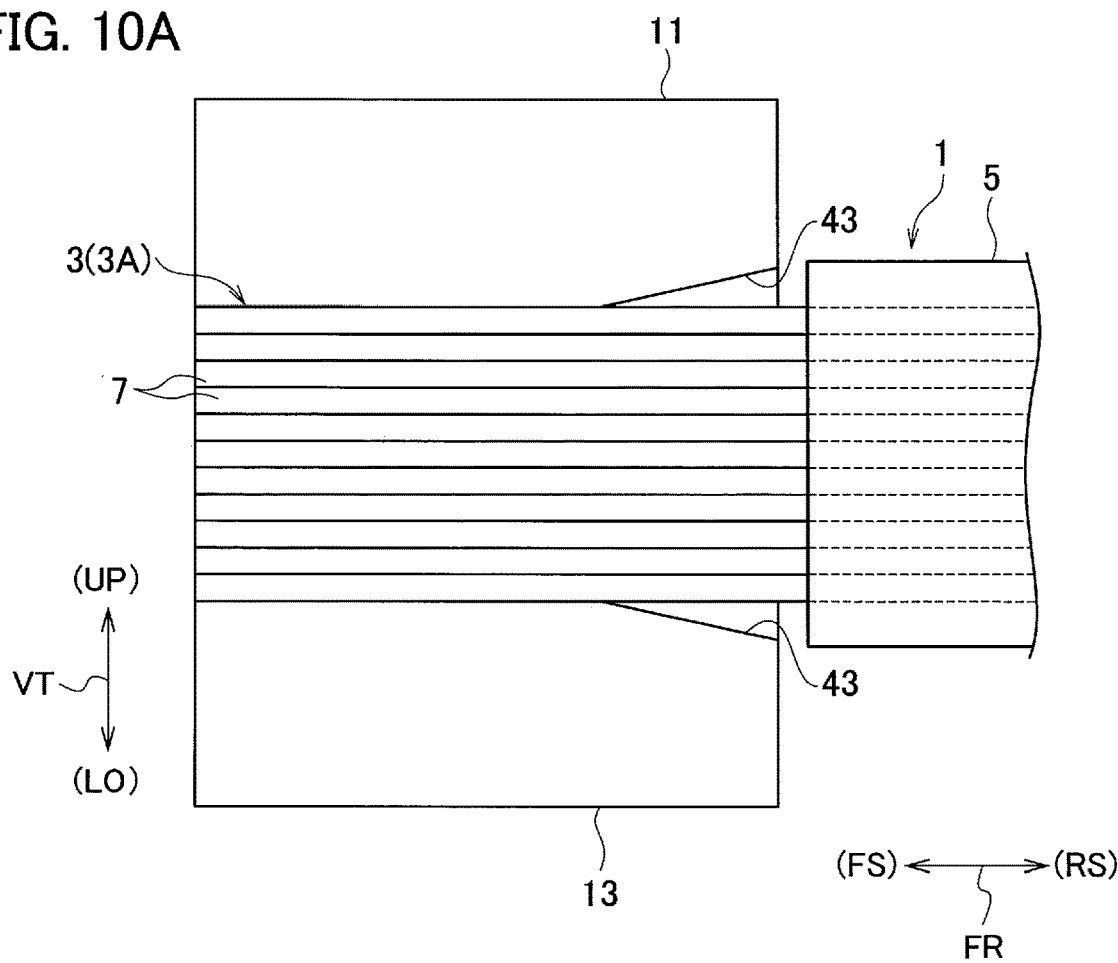
FIG. 10A is a diagram illustrating a bonding method for a conductor of an electric wire according to a modification.
Figure 10B:
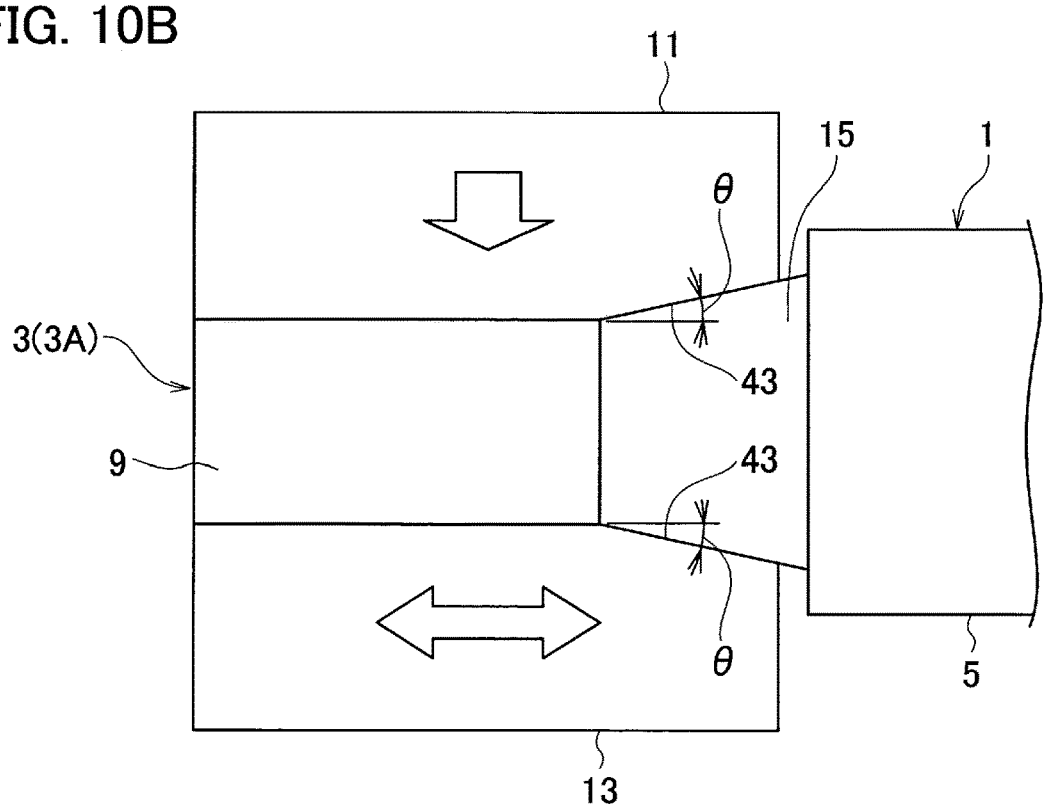
FIG. 10B is a diagram illustrating a bonding method for a conductor of an electric wire according to a modification.

Furthermore, as illustrated in FIGS. 10A and 10B, the anvil 11 and the horn 13 may be provided with an inclined surface 43. The inclined surface 43 is formed in such a manner that the above-mentioned angle θ is formed at a portion of the middle portion 15 of the conductor 3 of the electric wire 1 on the side of the bonded portion 9 and is in contact with the conductor 3 over a predetermined length.

Figure 9A:
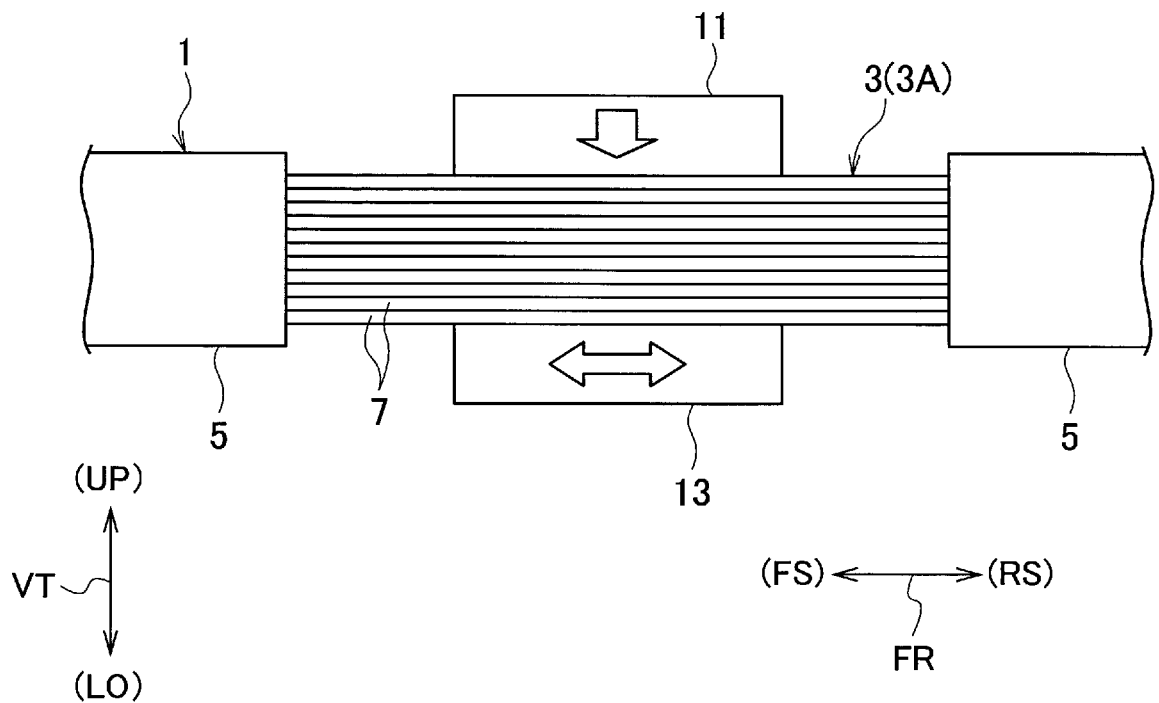
FIG. 9A is a diagram illustrating a bonding method for a conductor of an electric wire according to a modification.
Figure 9B:
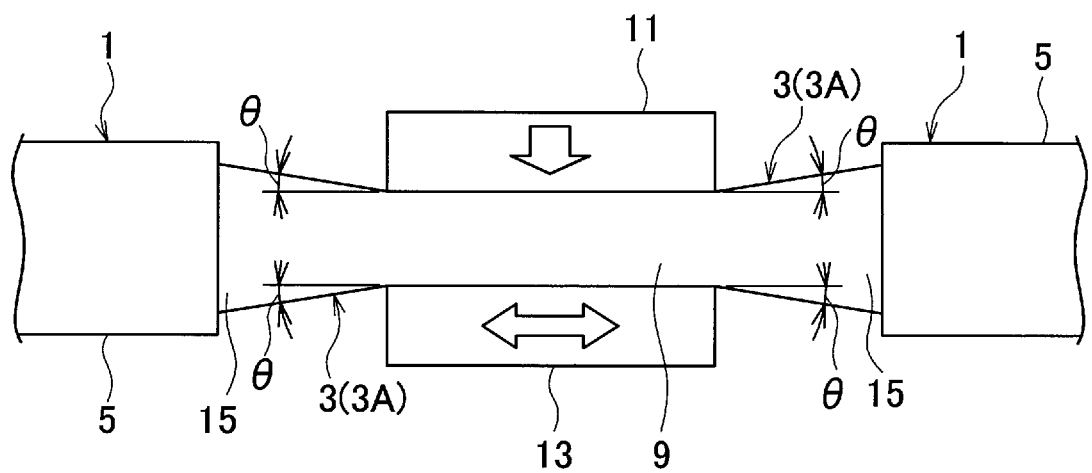
FIG. 9B is a diagram illustrating a bonding method for a conductor of an electric wire according to a modification.

Although the bonded portion 9 is formed at one end in the longitudinal direction of one electric wire 1 in the above description, as illustrated in FIGS. 9A and 9B, the bonded portion 9 is formed at the middle portion of one electric wire 1 in the longitudinal direction.

As illustrated in FIGS. 7A to 8B, strands 7 of conductors 3 of a plurality of electric wires (for example, two electric wires) 1 may be ultrasonically bonded to each other to form one bonded portion 9.

Figure 7A:
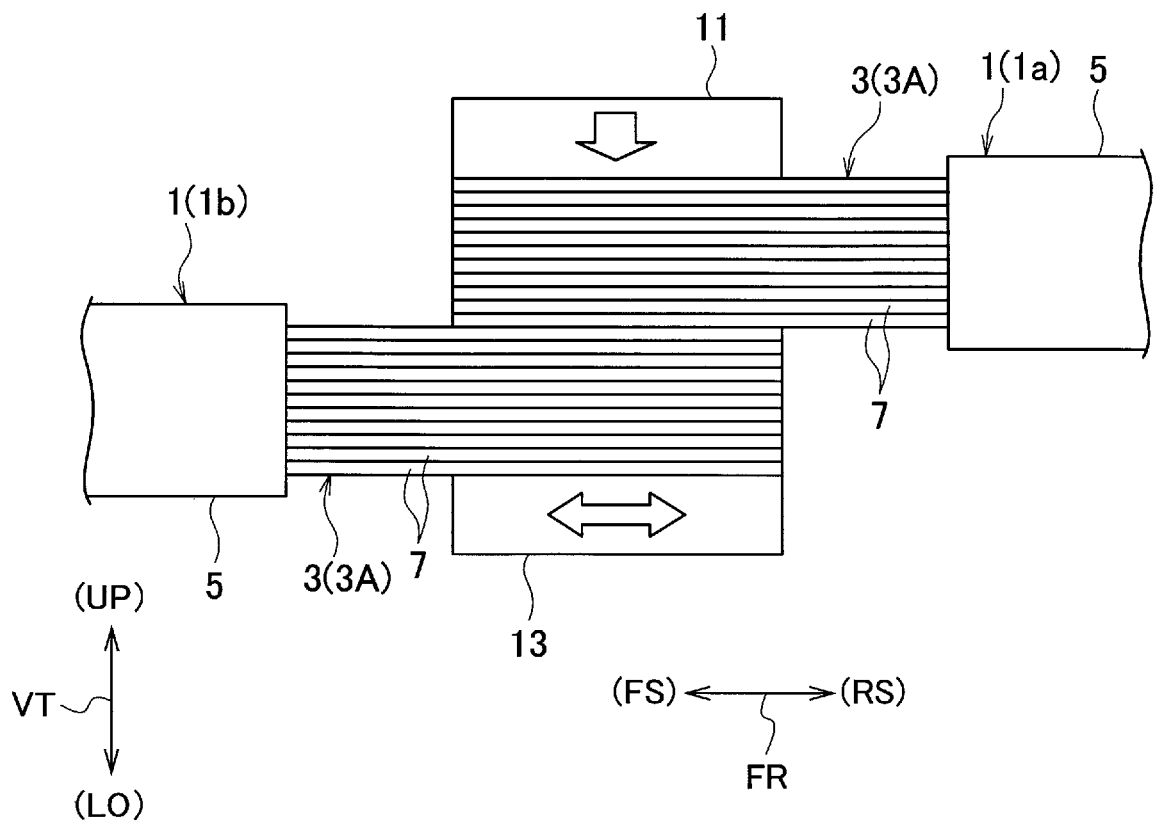
FIG. 7A is a diagram illustrating a bonding method for a conductor of an electric wire according to a modification.
Figure 7B:
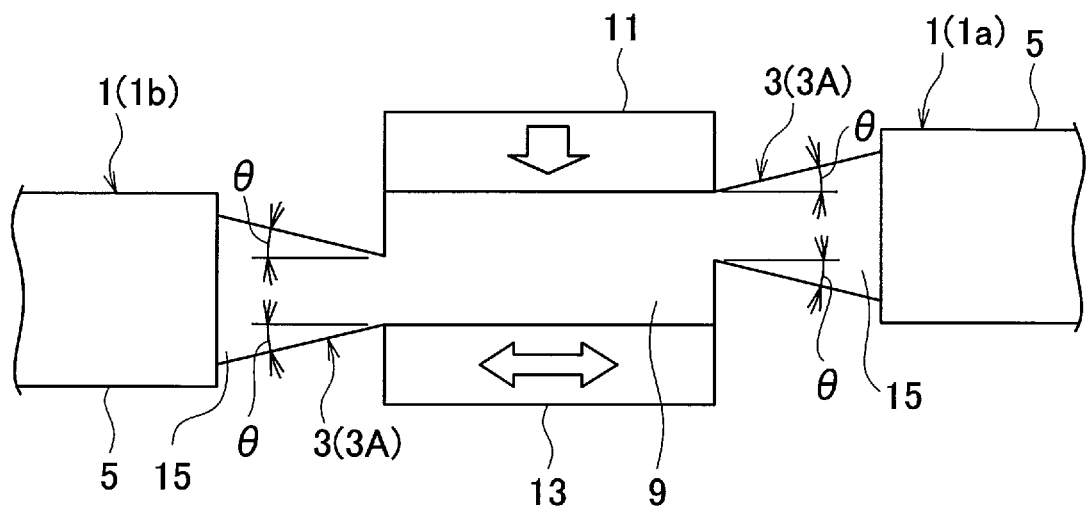
FIG. 7B is a diagram illustrating a bonding method for a conductor of an electric wire according to a modification.

In the embodiment illustrated in FIGS. 7A and 7B, by forming the bonded portion 9 at an end of one electric wire 1 (1a) and an end of the other electric wire 1 (1b), the electric wire 1a and the electric wire 1b are connected in series, so that the electric wire 1b is connected to the electric wire 1a at the bonded portion 9, and the electric wire 1a and the electric wire 1b extends in a single straight line.

Figure 8A:
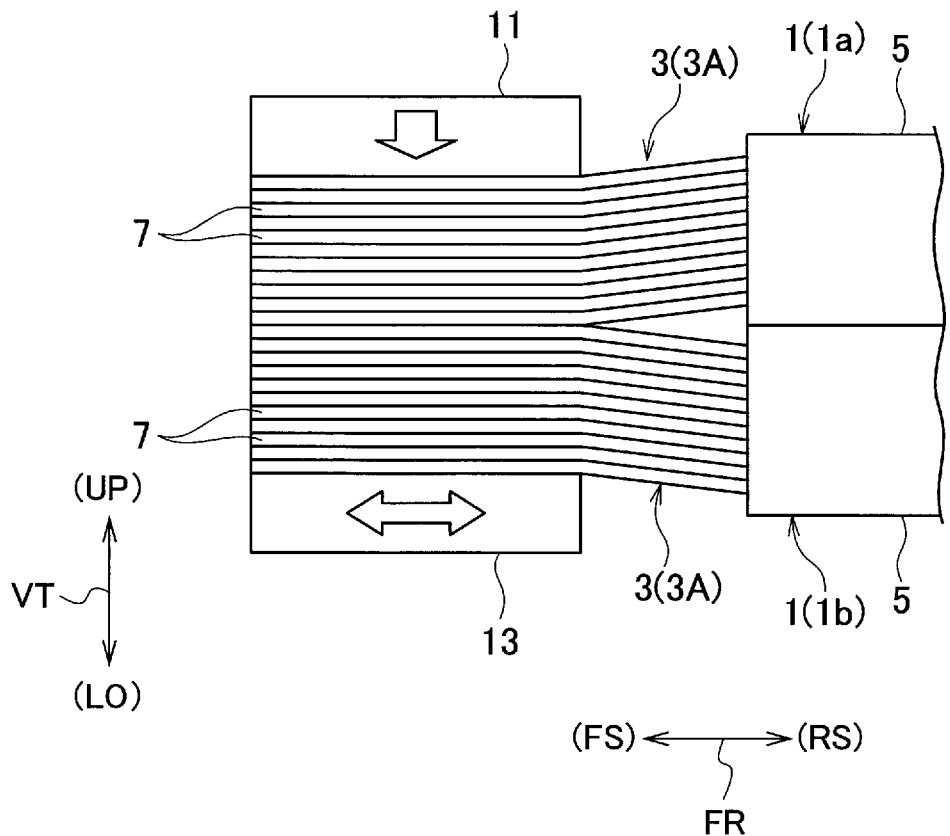
FIG. 8A is a diagram illustrating a bonding method for a conductor of an electric wire according to a modification.
Figure 8B:
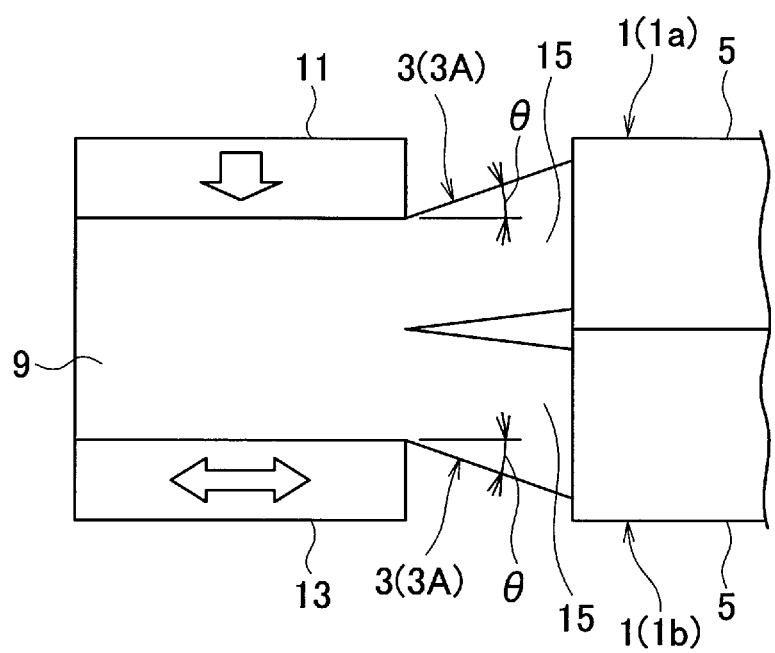
FIG. 8B is a diagram illustrating a bonding method for a conductor of an electric wire according to a modification.

In the embodiment illustrated in FIGS. 8A and 8B, by forming the bonded portion 9 at an end of one electric wire 1 (1a) and an end of the other electric wire 1 (1b), the electric wire 1a and the electric wire 1b are connected in parallel so that the electric wire 1a and the electric wire 1b extends in parallel from the bonded portion 9.

On the other hand, in the ultrasonic bonding of the conductor 3 of the electric wire 1, the bonding state of the bonded portion 9 may be inspected after the bonded portion 9 has been formed.

The inspection for the bonding state of the bonded portion 9 is performed in other to determine whether or not a strand (straggling strand) 7A that is not bonded to the bonded portion 9 exists, and as illustrated in FIGS. 11A to 14, the inspection is made by allowing a fluid (for example, air) to flow to the bonded portion 9 at a flow rate exceeding a predetermined speed.

More specifically, the inspection for the bonding state of the bonded portion 9 is performed, as illustrated in FIGS. 11A and 11B, and FIGS. 12A and 12B, by blowing compressed air of a predetermined pressure toward the bonded portion (see the arrow) from an ejection port (an ejection port with a predetermined inner diameter) of a jet nozzle (not illustrated) spaced apart from the bonded portion 9 by a predetermined distance.

Figure 11A:
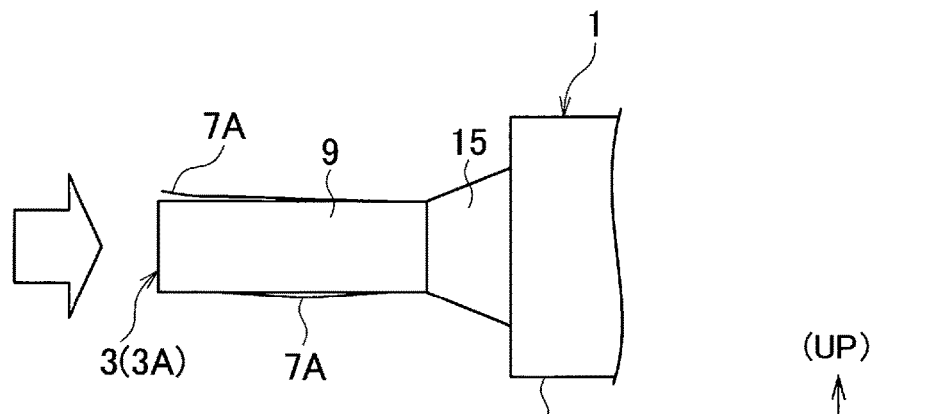
FIG. 11A is a diagram illustrating an electric wire in which some of strands are not bonded to a bonded portion and a state in which strands that are not bonded to the bonded portion (straggling strands) extend along the bonded portion.
Figure 11B:
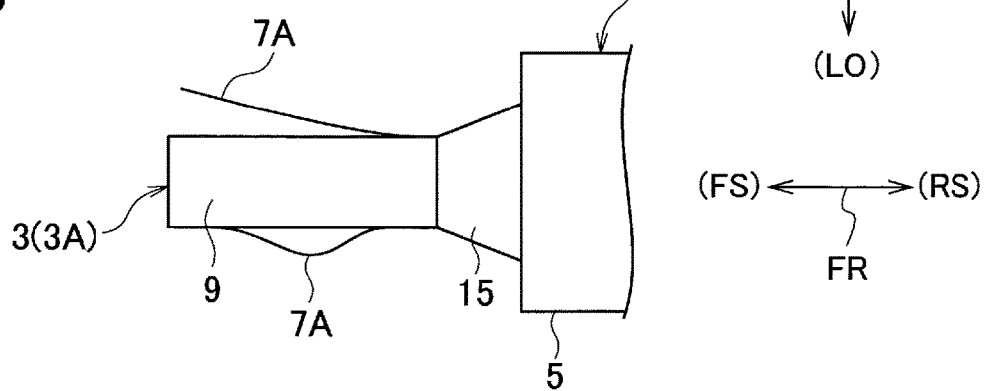
FIG. 11B is a diagram illustrating an electric wire in which some of strands are not bonded to a bonded portion and a state in which strands that are not bonded to the bonded portion are separated from the bonded portion and stretch out.

In the embodiment illustrated in FIGS. 11A and 11B, the jet nozzle is arranged on the front side than the front end of the bonded portion 9 of the electric wire 1, and the compressed air is jetted to the rear side from the jet nozzle for a predetermined time and is then brown to the bonded portion 9 positioned on the rear side of the jet nozzle.

FIG. 11A illustrates a state before compressed air is blown, and FIG. 11B illustrates a state after compressed air is blown.

In FIG. 11A, a strand 7A that is not bonded to the bonded portion 9 substantially sticks to the bonded portion 9, and it is difficult to determine whether or not the strand 7A that is not bonded to the bonded portion 9 exist with the naked eye (visual inspection by visual observation).

In this regard, in FIG. 11B, the strand 7A that is not bonded to the bonded portion 9 is deformed by the compressed air and is separated from the bonded portion 9 so that it is possible to easily determine whether or not the strand 7A that is not bonded to the bonded portion 9 exist even with the naked eye.

Figure 12B:
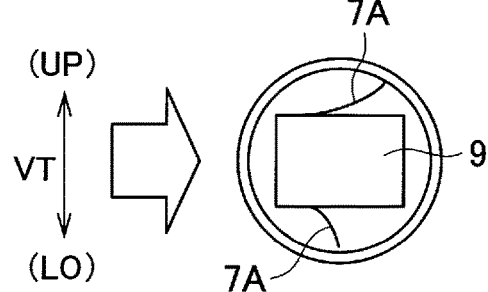
FIG. 12B is a side view of FIG. 12A.
Figure 12A:
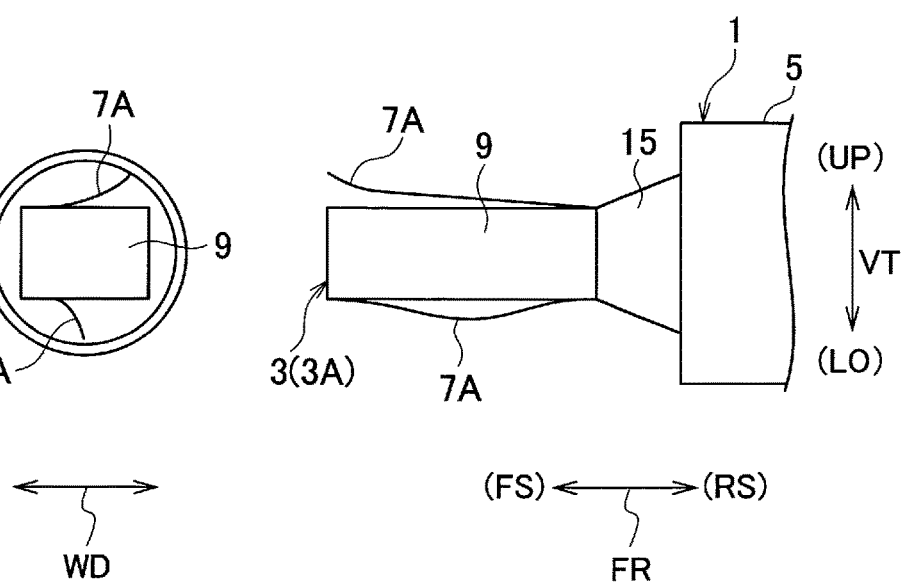
FIG. 12A is a diagram illustrating an electric wire in which some of strands are not bonded to a bonded portion and a state in which strands that are not bonded to the bonded portion are separated from the bonded portion and stretch out.
Figure 15:
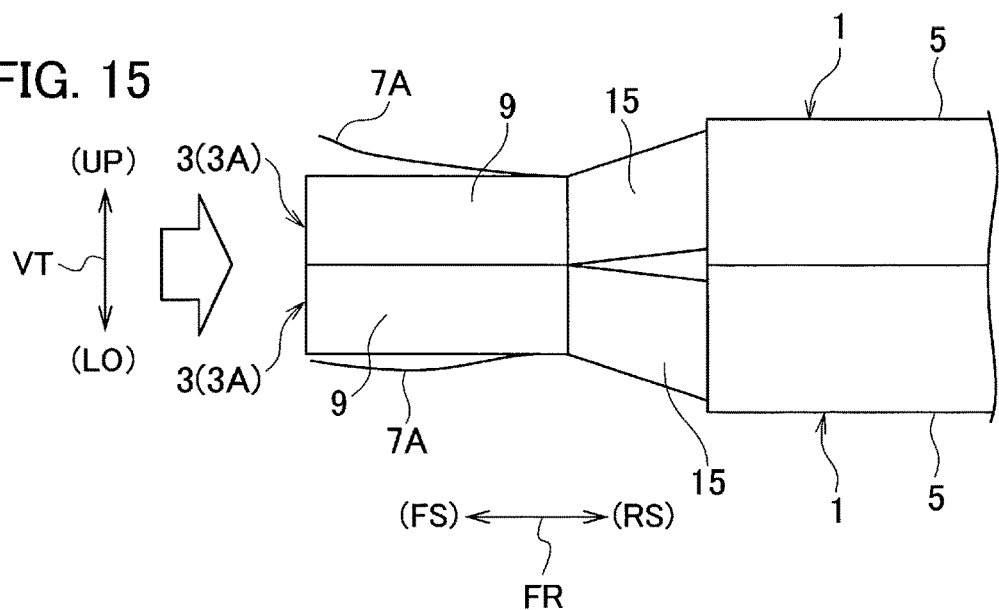
FIG. 15 is a diagram illustrating a modification of FIGS. 11A to 14B.
Figure 16:
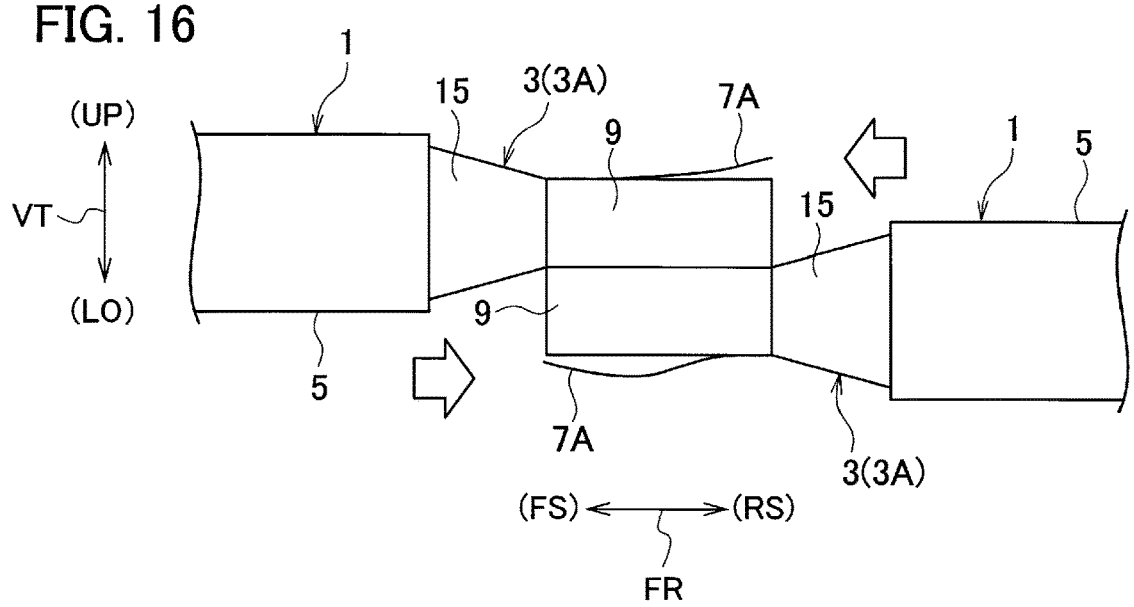
FIG. 16 is a diagram illustrating a modification of FIGS. 11A to 14B.
Figure 17:
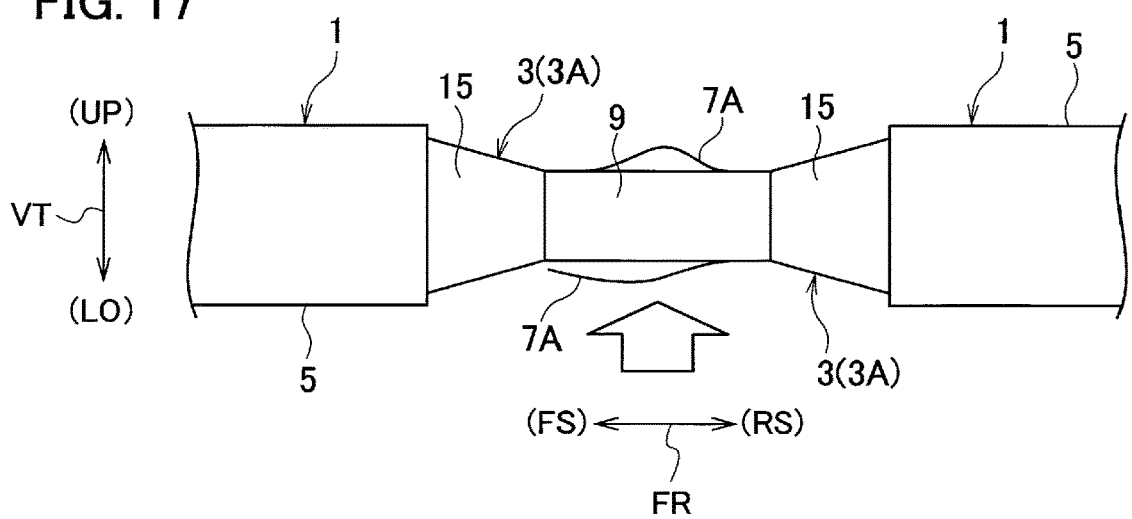
FIG. 17 is a diagram illustrating a modification of FIGS. 11A to 14B.

In the embodiment illustrated in FIGS. 12A and 12B, the jet nozzle is arranged on the lateral side of the bonded portion 9, and the compressed air is blown toward the bonded portion 9 from the direction (for example, width direction) orthogonal to the longitudinal direction (the front rear direction) of the electric wire 1 for a predetermined time.

FIGS. 12A and 12B illustrate a state after compressed air is blown, and in FIGS. 12A and 12B, the strand 7A that is not bonded to the bonded portion 9 is deformed by the compressed air and is separated from the bonded portion 9 so that it is possible to easily determine whether or not the strand 7A that is not bonded to the bonded portion 9 exist even with the naked eye.

In addition, the inspection for the bonding state of the bonded portion 9 may be performed, as illustrated in FIGS. 13A and 13B, by sucking air by a suction port (a suction port with a predetermined inner diameter) of a suction nozzle (not illustrated) spaced apart from the bonded portion 9 by a predetermined distance at a predetermined flow rate (see the arrow).

In the embodiment illustrated in FIGS. 13A and 13B, suction nozzles are arranged on the lower side and the upper side of the bonded portion 9 to suck air from the lower side and the upper side of the bonded portion 9. In FIGS. 13A and 13B, what are indicated by reference numeral 7A are the strands 7A that are not bonded to the bonded portion 9 and are separated from the bonded portion 9.

In the embodiments illustrated in FIGS. 12 to 14, in order to inspect the whole of the bonded portion 9 all over, it may be possible that the jet nozzle and the suction nozzle is relatively moved or rotated (rotation in the case of the bonded portion 9, revolution in the case of the nozzle) with respect to the bonded portion 9 (electric wire 1), and the compressed air is blown or the air is sucked.

In addition, air may be blown or sucked by the nozzle intermittently. For example, the flow of air may be turned on and off every second.

Further, the bonding state of the bonded portion 9 may be inspected by applying an acceleration exceeding a predetermined magnitude to the bonded portion 9 as illustrated in FIGS. 14A and 14B.

In the embodiment illustrated in FIGS. 14A and 14B, the strand 7A that is not bonded to the bonded portion 9 is separated from the bonded portion 9 by centrifugal force generated when the bonded portion 9 is rotated around the central axis C1 at a speed equal to or higher than a predetermined rotation speed.

Instead of or in addition to rotating of the bonded portion 9, by performing shaking of the bonded portion 9 or the like, the strands 7 may be separated from the bonded portion 9 by inertial force of the strand 7A that are not bonded to the bonded portion 9.

Further, after the bonded portion 9 is formed, by performing at least one (for example both) of: allowing a fluid having a flow rate exceeding a predetermined speed to flow to the bonded portion 9; and applying an acceleration exceeding a predetermined magnitude to the bonded portion 9, the bonding state of the bonded portion 9 may be inspected.

Further, after the strand 7A that is not bonded to the bonded portion 9 is separated from the bonded portion 9, inspection may be performed not by visual inspection but by an inspection apparatus having an imaging part, an image processing part, a memory, or a CPU. That is, after the strand 7A that is not bonded to the bonded portion 9 is separated from the bonded portion 9, the bonded portion 9 and the strand 7A are photographed by the imaging part, and the photographed image data is processed by the image processing part, and the strand 7A that is not bonded to the bonded portion 9 may be detected.

In addition, by allowing a fluid having a flow rate exceeding a predetermined speed to flow to the middle portion 15 or applying an acceleration exceeding a predetermined magnitude to the middle portion 15, the strand breakage occurring in the middle portion 15 may be inspected.

According to the electric wire 1, since a distance from the anvil 11 or the horn 13 to the sheath 5 of the electric wire 1 is shorter than a length of the strands 7 when the strand 7 vibrates in the primary mode by ultrasonic vibration, the vibration of the strand 7 is effectively suppressed and a specific portion cannot be subjected to repeated stress, thereby preventing occurrence of strand breakage when ultrasonic bonding is performed.

Further, according to the electric wire 1, the maximum value θ of the intersection angle between the longitudinal direction of the electric wire 1 and the strand 7 in the middle portion 15 of the conductor 3 is smaller than the predetermined angle θa, and the predetermined angle θa is an angle at which all of the strands 7 of the middle portion 15 can be prevented from being broken at the time of ultrasonic bonding, thereby preventing occurrence of strand breakage when ultrasonic bonding is performed.

Further, according to the electric wire 1, the maximum value θ of the intersection angle between the longitudinal direction of the electric wire 1 and the strand 7 in the middle portion 15 of the conductor 3 is smaller than the predetermined angle θa, and the predetermined angle θa is an angle at which fatigue fracture cannot be caused in all of the strands 7 of the middle portion 15 at the time of ultrasonic bonding, thereby more reliably preventing occurrence of strand breakage at the time of ultrasonic bonding.

Further, according to the electric wire 1, since the inclined surface 43 is formed on the anvil 11 and the horn 13, a portion of the middle portion 15 on the side of the bonded portion 9 is also clamped between the anvil 11 and the horn 13 appropriately when ultrasonic bonding is performed. As a result, it is possible to accurately hold the boundary between the bonded portion 9 and the middle portion 15 and the vicinity thereof and to suppress occurrence of stress concentration in the strand 7 in the boundary between the bonded portion 9 and the middle portion 15.

Further, according to the electric wire 1, after the bonded portion 9 is formed, by allowing a fluid having a flow rate exceeding a predetermined speed to flow into the bonded portion 9 or applying an acceleration exceeding a predetermined magnitude to the bonded portion 9, it is possible to easily discover a strand 7 that does not form the bonded portion 9 with the naked eye.

That is, only when the bonded portion 9 is simply formed, it seems like that the strand 7 that is not bonded to the bonded portion 9 also extend in the front rear direction in a manner that it sticks to the bonded portion 9 and is integrated with the bonded portion 9.

However, by allowing a fluid having a flow rate exceeding a certain speed to flow to the bonded portion 9 or applying an acceleration exceeding a predetermined magnitude to the bonded portion 9, a strand (for example, one strand which exists alone) 7A that does not form the bonded portion 9 is separated from the bonded portion 9 and stretches out. As a result, the strand 7A that is not bonded to the bonded portion 9 can be easily found with the naked eye, and defective products can be eliminated.

Further, according to the electric wire 1, since a part of the sheath 5 is held when ultrasonic bonding of the strands 7 is performed, it is possible to reliably prevent the strands 7 from being vibrated in the portion of the conductor 3 covered with the sheath 5 and to precisely secure the length x of the middle portion 15, thereby more reliably preventing occurrence of strand breakage at the time of ultrasonic bonding.

Although the bonded portion 9 is formed by ultrasonic bonding in the above description, the bonded portion 9 may be formed by other treatments than the ultrasonic treatment, such as cold welding, friction stir welding, friction welding, electromagnetic welding, diffusion welding, brazing, soldering, resistance welding, electron beam welding, laser welding, and light beam welding.

What is claimed is:

1. An electric wire including a conductor formed of a plurality of strands and a sheath covering the conductor such that the conductor is exposed by a predetermined length, the electric wire comprising:
   a bonded portion spaced apart from the sheath by the predetermined length, in which the plurality of strands of the conductor, which are bonded to each other, are exposed from the sheath; and
   a middle portion of the conductor formed between the bonded portion and the sheath, wherein
   an outer diameter of the bonded portion is smaller than an outer diameter of the conductor in a portion covered with the sheath, and an outer diameter of the middle portion of the conductor gradually decreases toward the bonded portion from the portion of the conductor covered with the sheath,
   a maximum value of an intersection angle between an upper surface of the bonded portion or a longitudinal direction of the electric wire and the plurality of the strands in the middle portion of the conductor is smaller than a predetermined angle,
   the predetermined angle is an angle at which breakage of all the plurality of the strands in the middle portion due to formation of the bonded portion is prevented, and
   wherein the predetermined angle has a value that is less than a value θb, calculated according to the following formula:

$$\theta b = \cos^{-1}(1/(1+\epsilon))$$

wherein ϵ indicates a distortion of a strand of the plurality of strands having the maximum value of the intersection angle.

2. The electric wire according to claim 1, wherein the bonded portion is formed in a state in which ultrasonic bonding is completed using an anvil and a horn, and a distance between the bonded portion and the sheath of the electric wire is shorter than a length of the plurality of strands when the plurality of strands are vibrated in a primary mode by ultrasonic vibration.

3. The electric wire according to claim 1, wherein the strand of the plurality of strands having the maximum value of the intersection angle is a strand positioned on an outer periphery of the middle portion.

\* \* \* \* \*